United States Patent
Lee et al.

(10) Patent No.: US 9,263,185 B2
(45) Date of Patent: Feb. 16, 2016

(54) MULTILAYER CERAMIC CAPACITOR AND CIRCUIT BOARD FOR MOUNTING THE SAME

(71) Applicant: SAMSUNG ELECTRO-MECHANICS CO., LTD., Suwon, Gyunggi-do (KR)

(72) Inventors: Byoung Hwa Lee, Gyunggi-do (KR); Young Ghyu Ahn, Gyunggi-do (KR); Sang Soo Park, Gyunggi-do (KR); Min Cheol Park, Gyunggi-do (KR); Tae Hyeok Kim, Gyunggi-do (KR); Heung Kil Park, Gyunggi-do (KR)

(73) Assignee: SAMSUNG ELECTRO-MECHANICS CO., LTD., Gyunggi-Do (KR)

( * ) Notice: Subject to any disclaimer, the term of this patent is extended or adjusted under 35 U.S.C. 154(b) by 387 days.

(21) Appl. No.: 13/764,220

(22) Filed: Feb. 11, 2013

(65) Prior Publication Data

US 2014/0166351 A1  Jun. 19, 2014

(30) Foreign Application Priority Data

Dec. 18, 2012  (KR) .......................... 10-2012-0148252

(51) Int. Cl.
  *H01G 4/30* (2006.01)
  *H01G 4/06* (2006.01)
  *H01G 2/06* (2006.01)
  *H01G 4/005* (2006.01)
  (Continued)

(52) U.S. Cl.
  CPC ................. *H01G 2/06* (2013.01); *H01G 4/005* (2013.01); *H01G 4/12* (2013.01); *H05K 3/3442* (2013.01); *H05K 2201/10015* (2013.01); *H05K 2201/2045* (2013.01)

(58) Field of Classification Search
  USPC ............................................. 361/301.4, 311
  See application file for complete search history.

(56) References Cited

U.S. PATENT DOCUMENTS

| | | | |
|---|---|---|---|
| 6,377,439 | B1 | 4/2002 | Sekidou et al. |
| 2006/0158827 | A1 | 7/2006 | Lee et al. |
| 2012/0300361 | A1 | 11/2012 | Togashi |

FOREIGN PATENT DOCUMENTS

| | | | |
|---|---|---|---|
| JP | 6-215978 A | 8/1994 | |
| JP | 8-130160 A | 5/1996 | |

(Continued)

OTHER PUBLICATIONS

Office Action issued in Japaense Patent Application No. 2013-022086 dated Nov. 26, 2013 with English language translation.

(Continued)

*Primary Examiner* — Eric Thomas
(74) *Attorney, Agent, or Firm* — McDermott Will & Emery LLP (57) ABSTRACT

A multilater ceramic capacitor includes: a ceramic body in which a plurality of dielectric layers are laminated; and an active layer including a plurality of first and second internal electrodes formed to be alternately exposed to both end surfaces of the ceramic body with the dielectric layer interposed therebetween, and forming capacitance. An upper cover layer is formed on an upper portion of the active layer; a lower cover layer is formed on a lower portion of the active layer and having a thickness greater than that of the upper cover layer. First and second external electrodes cover both end surfaces of the ceramic body. Specific sizing of ceramic body and electrodes is defined.

10 Claims, 6 Drawing Sheets

(51) Int. Cl.
*H01G 4/12* (2006.01)
*H05K 3/34* (2006.01)

(56) References Cited

FOREIGN PATENT DOCUMENTS

| JP | 2000-150292 A | 5/2000 |
| JP | 2001-35738 A | 2/2001 |
| JP | 2006-203165 A | 8/2006 |
| JP | 2012-248581 A | 12/2012 |

OTHER PUBLICATIONS

Korean Office Action issued in Korean Application No. 10-2012-0148252 dated Feb. 4, 2014, w/English translation.
Examination Report dated Nov. 25, 2014 issued in the corresponding Taiwanese Patent Application No. 102104164 (English translation).

MULTILAYER CERAMIC CAPACITOR AND CIRCUIT BOARD FOR MOUNTING THE SAME

CROSS-REFERENCE TO RELATED APPLICATIONS

This application claims the priority of Korean Patent Application No. 10-2012-0148252 filed on Dec. 18, 2012, in the Korean Intellectual Property Office, the disclosure of which is incorporated herein by reference.

BACKGROUND OF THE INVENTION

1. Field of the Invention

The present invention relates to a multilayer ceramic capacitor and a circuit board with a multilayer ceramic capacitor mounted thereon.

2. Description of the Related Art

A multilayer ceramic capacitor, a laminated chip electronic component, is a chip-type condenser installed on a printed circuit board (PCB) of various electronic products such as imaging devices (or video apparatuses) like liquid crystal displays (LCDs), plasma display panels (PDPs), and the like, computers, smart phones, portable phones, and the like, to charge and discharge electricity.

A multilayer ceramic capacitor (MLCC), having advantages such as compactness, guaranteed high capacity, and ease of mountability, may be used as a component of various electronic devices.

The MLCC may include a plurality of dielectric layers and internal electrode, having a structure in which internal electrodes having different polarities are alternately laminated between the dielectric layers.

The dielectric layers have piezoelectric and electrostrictive properties. Thus, when a DC or AC voltage is applied to an MLCC, a piezoelectric phenomenon occurs between internal electrodes, generating vibrations.

Vibrations are transferred to a PCB on which the MLCC is mounted, through solders of the MLCC, inducing the entirety of the PCB to become an acoustically radiating surface to generate vibratory sound as noise.

Vibratory sound may correspond to audio frequencies ranging from 20 Hz to 2000 Hz, making users uncomfortable, and such vibrating sound which may cause discomfort to users is known as acoustic noise.

In order to reduce acoustic noise, a product in which a lower cover layer of an MLCC is increased has been studied.

Also, an MLCC having an increased lower cover layer is mounted as a horizontal mounting type MLCC such that a relatively thick lower cover layer is positioned on the bottom on a printed circuit board (PCB) to advantageously reduce acoustic noise.

Meanwhile, in the case of a product in which a thickness of a lower cover layer of an MLCC is increased in order to reduce acoustic noise, an amount of laminations is increased or dielectric layers are thinned in order to implement high capacitance, causing a delamination defect or a degradation of breakdown voltage (BDV).

RELATED ART DOCUMENT (Patent document 1) Japanese Patent Laid Open Publication No. 2006-203165

SUMMARY OF THE INVENTION

An aspect of the present invention provides a multilayer ceramic capacitor (MLCC) and a circuit board with an MLCC mounted thereon.

According to an aspect of the present invention, there is provided a multilayer ceramic capacitor including: a ceramic body in which a plurality of dielectric layers are laminated; an active layer including a plurality of first and second internal electrodes formed to be alternately exposed to both end surfaces of the ceramic body with the dielectric layer interposed therebetween, and forming capacitance; an upper cover layer formed on an upper portion of the active layer; a lower cover layer formed on a lower portion of the active layer and having a thickness greater than that of the upper cover layer; and first and second external electrodes covering both end surfaces of the ceramic body, wherein when a width of an L-margin portion formed between an end of the internal electrode in a length direction and one end surface of the ceramic body is LM, a width of a W-margin portion formed between a side of the internal electrode in a width direction and one lateral surface of the ceramic body is WM, and a thickness of the lower cover layer is B, $0.3 \leq LM/B \leq 2.0$ and $0.5 \leq B/WM \leq 5.0$ are satisfied.

When half of the overall thickness of the ceramic body is A, a thickness of the lower cover layer is B, half of the overall thickness of the active layer is C, a thickness of the upper cover layer is D, a ratio $(B+C)/A$ by which a central portion of the active layer deviates from a central portion of the ceramic body may satisfy $1.063 \leq (B+C)/A \leq 1.745$.

When the thickness of the lower cover layer is B and the thickness of the upper cover layer is D, a ratio (D/B or D:B) between the thickness D of the upper cover layer and the thickness B of the lower cover layer may satisfy a range of $0.021 \leq D/B \leq 0.422$.

When half of the overall thickness of the ceramic body is A and the thickness of the lower cover layer is B, a ratio (B/A) of the thickness B of the lower cover layer to half A of the thickness of the ceramic body may satisfy a range of $0.329 \leq B/A \leq 1.522$.

When the thickness of the lower cover layer is B and half of the overall thickness of the active layer is C, a ratio (C/B) of the half of the thickness of the active layer C to the thickness B of the lower cover layer may satisfy a range of $0.146 \leq C/B \leq 2.458$.

Due to a difference between strain generated in the central portion of the active layer and that generated in the lower cover layer when a voltage is applied, a point of inflection (PI) formed at both end portions of the ceramic body may be formed below the central portion of the ceramic body in the thickness direction.

According to another aspect of the present invention, there is provided a circuit board for allowing a multilayer ceramic capacitor (MLCC) to be mounted thereon, including: a printed circuit board having first and second electrode pads formed on an upper portion thereof; and an MLCC installed on the PCB, wherein the MLCC includes a ceramic body in which a plurality of dielectric layers are laminated, an active layer including a plurality of first and second internal electrodes formed to be alternately exposed to both end surfaces of the ceramic body with the dielectric layer interposed therebetween, and forming capacitance, an upper cover layer formed on an upper portion of the active layer, a lower cover layer formed on a lower portion of the active layer and having a thickness greater than that of the upper cover layer, and first and second external electrodes formed on both end surfaces of the ceramic body and connected to the first and second electrode pads by solders, wherein when a width of an L-margin portion formed between an end portion of the internal electrode in a length direction and one end surface of the ceramic body is LM, a width of a W-margin portion formed between a side of the internal electrode in a width direction and one lateral surface of the ceramic body is WM, and a thickness of the lower cover layer is B, $0.3 \leq LM/B \leq 2.0$ and $0.5 \leq B/WM \leq 5.0$ are satisfied.

When half of the overall thickness of the ceramic body is A, a thickness of the lower cover layer is B, half of the overall thickness of the active layer is C, a thickness of the upper cover layer is D, a ratio (B+C)/A by which a central portion of the active layer deviates from a central portion of the ceramic body may satisfy $1.063 \leq (B+C)/A \leq 1.745$.

When the thickness of the lower cover layer is B and the thickness of the upper cover layer is D, a ratio (D/B or D:B) between the thickness D of the upper cover layer and the thickness B of the lower cover layer may satisfy a range of $0.021 \leq D/B \leq 0.422$.

When half of the overall thickness of the ceramic body is A and the thickness of the lower cover layer is B, a ratio (B/A) of the thickness B of the lower cover layer to half A of the thickness of the ceramic body may satisfy a range of $0.329 \leq B/A \leq 1.522$.

When the thickness of the lower cover layer is B and half of the overall thickness of the active layer is C, a ratio (C/B) of the half of the thickness of the active layer C to the thickness B of the lower cover layer may satisfy a range of $0.146 \leq C/B \leq 2.458$.

Due to a difference between strain generated in the central portion of the active layer and that generated in the lower cover layer when a voltage is applied, a point of inflection (PI) formed at both end portions of the ceramic body may be formed below the central portion of the ceramic body in the thickness direction.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Embodiments of the present invention will now be described in detail with reference to the accompanying drawings.

The invention may, however, be embodied in many different forms and should not be construed as being limited to the embodiments set forth herein.

Rather, these embodiments are provided so that this disclosure will be thorough and complete, and will fully convey the scope of the invention to those skilled in the art.

In the drawings, the shapes and dimensions of elements may be exaggerated for clarity, and the same reference numerals will be used throughout to designate the same or like components.

Also, elements having the same function within a scope of the same concept illustrated in drawings of respective embodiments will be described by using the same reference numerals.

In order to clarify embodiments of the present invention, directions of the hexahedron may be defined as follows: L, W, and T indicated in FIG. 1 denote a length direction, a width direction, and a thickness direction, respectively. Here, the thickness direction may be used to have the same concept as that of a lamination direction in which the dielectric layers are laminated.

Also, in the present embodiment, for the purposes of description, surfaces on which first and second external electrodes are formed in a length direction of the ceramic body are set as horizontal end surfaces and surfaces perpendicular thereto are set as left and right lateral surfaces.

Multilayer Ceramic Capacitor (MLCC)

Figure 1:
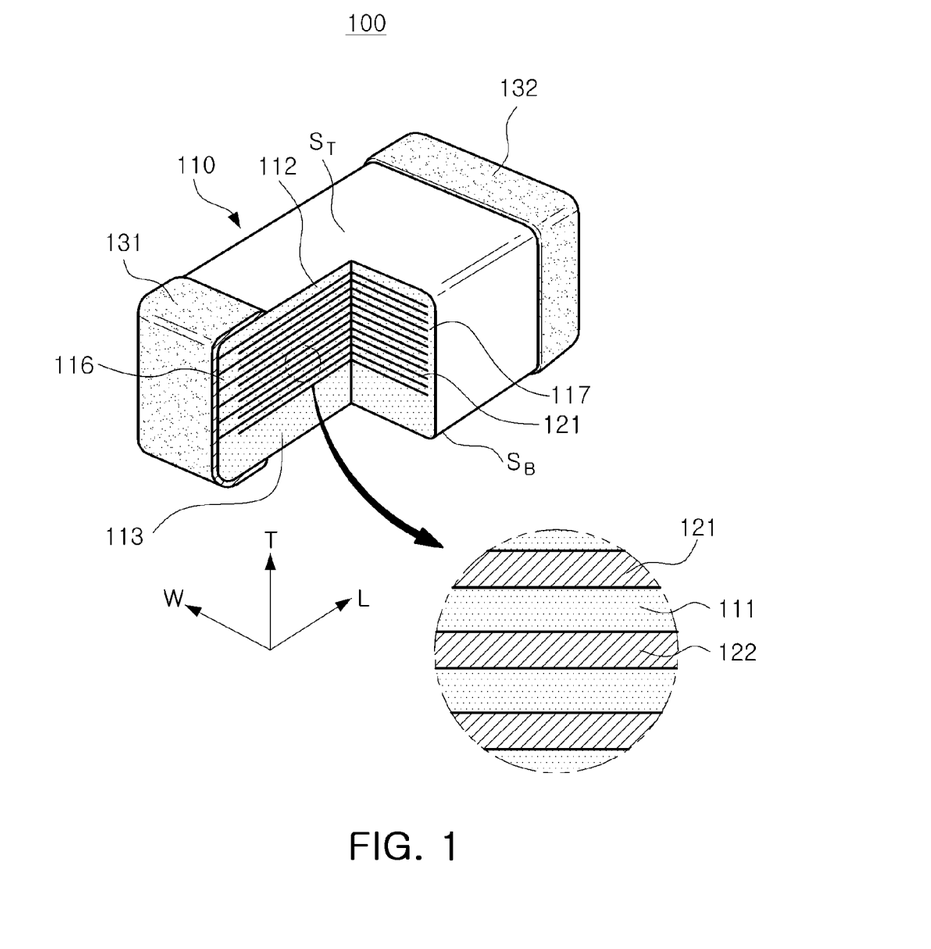
FIG. 1 is a partially cutaway schematic perspective view of a multilayer ceramic capacitor (MLCC) according to an embodiment of the present invention.
Figure 2:
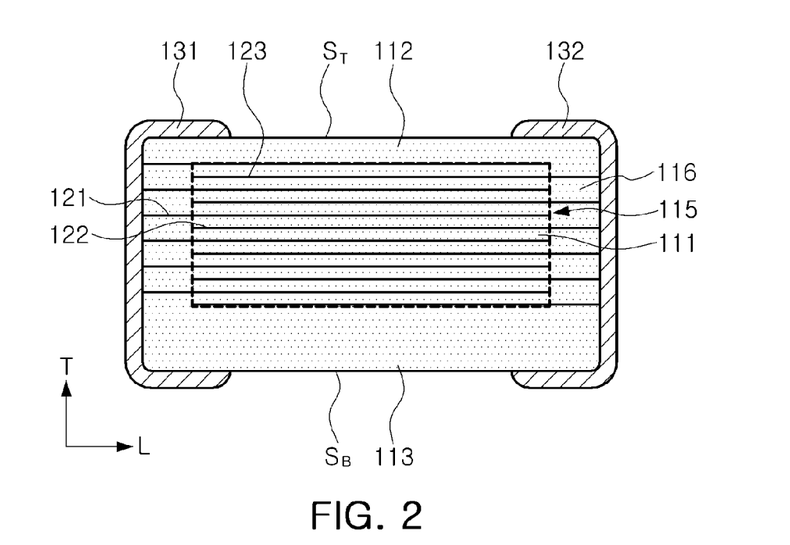
FIG. 2 is a cross-sectional view of the MLCC of FIG. 1 taken in length and thickness directions from a central portion of the MLCC in a width direction.
Figure 3:
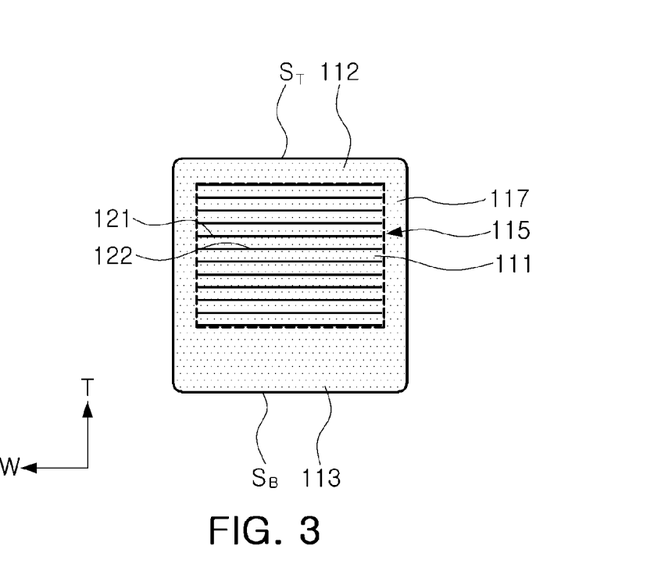
FIG. 3 is a cross-sectional view of the MLCC of FIG. 1 taken in width and thickness directions from the central portion of the MLCC in the length direction.

Referring to FIGS. 1 through 3, an MLCC 100 according to an embodiment of the present invention may include a ceramic body 110, an active layer 115 having first and second internal electrodes 121 and 122, upper and lower cover layers 112 and 113, and first and second external electrodes 131 and 132 covering both end surfaces of the ceramic body 110.

The ceramic body 110 is formed by laminating a plurality of dielectric layers 111 and subsequently firing the same, and a configuration and dimensions of the ceramic body 110 and a lamination amount of the dielectric layers 111 are not limited to those illustrated in the present embodiment.

Also, the plurality of dielectric layers 111 forming the ceramic body 110 are in a sintered state and adjacent dielectric layers 50 may be integrated such that boundaries therebetween may not be readily apparent without the use of a scanning electron microscope (SEM).

The ceramic body 110 may include the active layer 115 as a portion of the capacitor contributing to the formation of capacitance, upper and lower layers 112 and 113, as margin portions, formed on upper and lower portions of the active layer 115, an L-margin portion 116, as a length-direction margin portion, formed between the active layer 115 and an end surface of the ceramic body 110, and a W-margin portion 117, as a width-direction margin portion, formed between the active layer 115 and a lateral surface of the ceramic body 110.

The active layer 115 may be formed by iteratively laminating the first and second internal electrodes 121 and 122 with the dielectric layer 115 interposed therebetween.

Here, a thickness of the dielectric layer 111 may be arbitrarily changed according to design of capacitance of the MLCC 100. Preferably, a thickness of one dielectric layer 111 may range from 0.1 μm to 10.0 μm after a firing operation, but the present invention is not limited thereto.

Also, the dielectric layer 111 may be made of ceramic powder having high dielectric constant (or high K-dielectrics), e.g., a barium titanate ($BaTiO_3$)-based powder, a strontium titanate ($SrTiO_3$)-based powder, or the like, but the present invention is not limited thereto.

The upper and lower cover layers 112 and 123 may be made of the same material and have the same configuration as those of the dielectric layer 111, except that they do not include an internal electrode.

The upper and lower cover layers 112 and 123 may be formed by laminating a single dielectric layer or two or more dielectric layers on upper and lower surfaces of the active layer 115, and basically serve to prevent damage to the first and second internal electrodes 121 and 122 due to physical or chemical stress.

Also, the lower cover layer 113 may have a thickness greater than that of the upper cover layer 112, by increasing a lamination amount of the dielectric layers to be greater than that of the upper cover layer 112.

In addition, the MLCC according to an embodiment of the present invention may further include one or more dummy electrodes laminated in the thickness direction of the ceramic body 110 within the upper cover layer 112 such that they may be seen through from the upper surface $S_T$ of the ceramic body 110.

Thus, the upper surface $S_T$ where the upper cover layer 112 is formed and the lower surface $S_B$ where the lower cover layer 113 is formed can be clearly discriminated. Thus, when the MLCC 100 is mounted on a PCB, a vertical installation direction of the MLCC can be readily checked, preventing the MLCC from being mounted upside down, and thus, assembly characteristics of the mounting board can be enhanced and a defect rate of the mounting board can be reduced.

Here, in order to allow the dummy electrode to be easily seen through the upper surface $S_T$ of the ceramic body 110, a thickness E of an upper surface portion, in which no dummy electrode is formed, of the upper cover layer 112 may have a minimum thickness within a range of thicknesses sufficient to secure reliability.

Also, in order to allow the dummy electrode to be easily seen through the upper surface $S_T$ of the ceramic body 110, the dummy electrode disposed on the uppermost portion may be formed to be as close as possible to the upper surface ST of the ceramic body 110 within the upper cover layer 112.

The dummy electrodes may be formed as internal electrodes in the same direction as that of the first internal electrode 121 disposed on the uppermost portion of the active layer 115, and do not have a structure in which internal electrodes having different polarities overlap with a dielectric layer interposed therebetween.

Thus, the dummy electrodes do not contribute to formation of capacitance, except for parasitic capacitance generated due to an influence of the external electrodes 131 and 132 formed on both end portions of the ceramic body 110 in the length direction or the active layer 115 forming capacitance.

The structure of the dummy electrode according to an embodiment of the present invention may be variously modified as necessary, and the present invention is not limited thereto.

Meanwhile, the first and second internal electrodes 121 and 122, a pair of electrodes having different polarities, may be formed by printing a conductive paste including a conductive metal (on ceramic green sheets) to have a predetermined thickness, such that the first and second internal electrodes 121 and 122 are alternately exposed to both end surfaces in a lamination direction of the dielectric layers 111, and may be electrically insulated from one another by the dielectric layer 111 disposed therebetween.

Namely, the first and second internal electrodes 121 and 122 may be electrically connected to the first and second external electrodes 131 and 132 through portions thereof alternately exposed to both end surfaces of the ceramic body 110.

Thus, when a voltage is applied to the first and second external electrodes 131 and 132, charges are accumulated between the mutually facing first and second internal electrodes 121 and 122 and, here, capacitance of the MLCC 100 is proportional to an area of a mutually overlap region of the first and second internal electrodes 121 and 122.

A thickness of the first and second internal electrodes may be determined according to purposes. For example, a thickness of the first and second internal electrodes may be determined to range from 0.2 μm to 1.0 μm, but the present invention is not limited thereto.

Also, a conductive metal included in the conductive paste forming the first and second internal electrodes 121 and 122 may be nickel (Ni), copper (Cu), palladium (Pd), or an alloy thereof, but the present invention is not limited thereto.

Also, the conductive paste may be printed by using a screening method, a gravure printing method, or the like, but the present invention is not limited thereto.

The first and second external electrodes 131 and 132 may be made of a conductive paste including a conductive metal, and the conductive metal may be nickel (Ni), copper (Cu), palladium (Pd), gold (Au), or an alloy thereof, but the present invention is not limited thereto.

Hereinafter, a relationship between constituent elements included in the MLCC according to the present embodiment and acoustic noise will be described.

Figure 4:
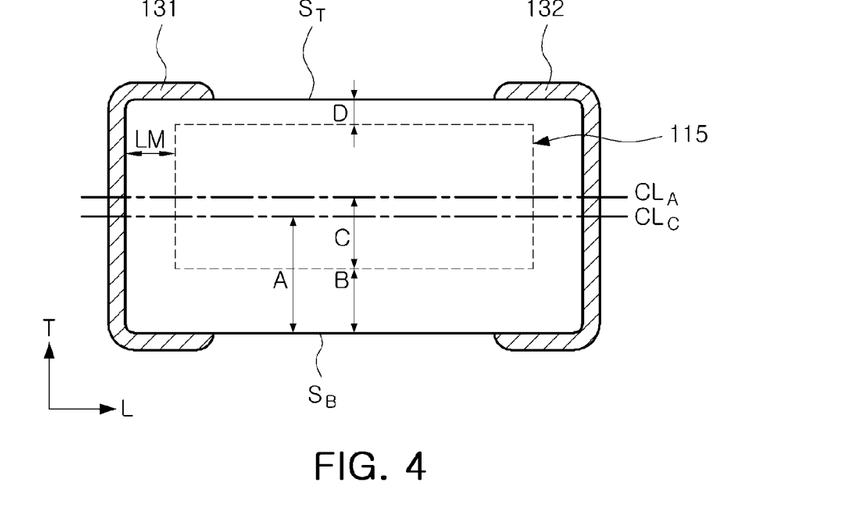
FIG. 4 is a schematic cross-sectional view of the MLCC of FIG. 1 taken in length and thickness directions from the central portion of the MLCC in the width direction to show dimensional relationships of components included in the MLCC.

Referring to FIG. 4, half of the overall thickness of the ceramic body 110 is A, a thickness of the lower cover layer 113 is B, half of the overall thickness of the active layer 115 is C, and a thickness of the upper cover layer 112 is D.

Here, the overall thickness of the ceramic body 110 refers to a distance from the upper surface $S_T$ of the ceramic body 110 to the lower surface $S_B$ thereof, and the overall thickness of the active layer 115 refers to a distance from an upper surface of the first internal electrode 121 formed on the uppermost portion of the active layer 115 to a lower surface of the second internal electrode 122 formed on the lowermost portion of the active layer 115.

Also, the thickness B of the lower cover layer 113 refers to a distance from the lower surface of the second internal electrode 122 formed on the lowermost portion of the active layer 115 in the thickness direction to the lower surface $S_B$ of the ceramic body 110, and the thickness D of the upper cover layer 112 refers to a distance from the upper surface of the first internal electrode 121 formed on the uppermost of the active layer 115 in the thickness direction to the upper surface $S_T$ of the ceramic body 110.

When voltages having different polarities are applied to the first and second external electrodes 131 and 132 formed on both end portions of the MLCC 100, the ceramic body 110 expands and contracts in the thickness direction due to inverse piezoelectric effect of the dielectric layers 111, while the both end portions of the first and second external electrodes 131 and 132 contract and expand due to a Poisson effect, contrary to the expansion and contraction of the ceramic body 110 in the thickness direction.

Here, the central portion of the active layer 115 is a portion which is maximally expanded and contracted in both end portions of the ceramic body 110 in the length direction of the first and second external electrodes 131 and 132, which causes acoustic noise.

Namely, in the present embodiment, in order to reduce acoustic noise, due to a difference between strain generated in the central portion $CL_A$ of the active layer 150 and that generated in the lower cover layer 113 as a voltage is applied, a point of inflection (PI) may be formed at both end portions of the ceramic body 110 below the central portion $CL_C$ of the ceramic body 110 in the thickness direction.

Here, in order to further reduce acoustic noise, preferably, the ratio ((B+C):A) by which the central portion $CL_A$ of the active layer 115 deviates from the central portion of the ceramic body 110 satisfies the range 1.063≤(B+C)/A≤1.745.

Also, the ratio (B:A) (or B/A) between half (A) of the thickness D of the ceramic body 110 and the thickness B of the lower cover layer 113 may satisfy the range 0.329≤B/A≤1.522.

Also, the ratio (C:B) between the thickness B of the lower cover layer 113 and the half (C) of the thickness of the active layer 115 may satisfy the range 0.146≤C/B≤2.458.

Next, a relationship between dimensions of the constituent elements included in the MLCC according to the present embodiment and a generation of cracks will be described.

Figure 5:
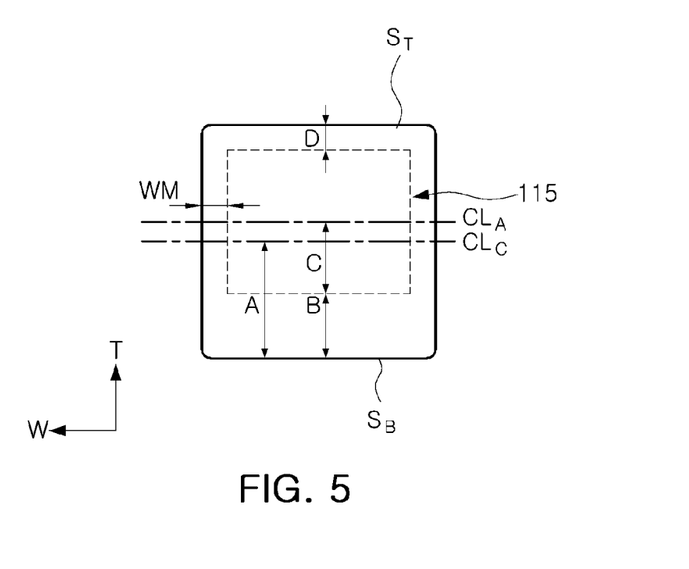
FIG. 5 is a schematic cross-sectional view of the MLCC of FIG. 1 taken in the width and thickness directions from the central portion of the MLCC in the length direction to show dimensional relationships of components included in the MLCC.

Referring to FIGS. 4 and 5, the width of the L-margin portion 116 formed between an end portion of the internal electrode in a length direction and one end surface of the ceramic body 110 is defined as LM, a width of the W-margin portion 117 formed between a side of the internal electrode in a width direction and one lateral surface of the ceramic body 110 is defined as WM, and A, B, C, and D are defined as described above.

Here, the L-margin portion 116 refers to a region in which internal electrodes do not overlap in the length direction of the ceramic body 110, not forming capacitance, and the W-margin portion 117 refers to a region in which internal electrodes do not overlap in the width direction of the ceramic body 110.

Also, LM refers to a distance between the active layer 115 and one end surface of the ceramic body 110 in the length-thickness directional cross-section (LT cross-section), and WM refers to a distance between the active layer 115 and one lateral surface of the ceramic body 110 in the width-thickness directional cross-section (WT cross-section).

In the case of the MLCC 100, a density difference occurs between the active layer 115 and the margin portion due to the presence or absence of the internal electrodes or a difference in the number of internal electrodes, which generates stress during a sintering process to cause cracks in or delamination of the ceramic body 110. Also, cracks are generated when debinding is not smoothly performed in the sintering process.

Thus, in order to prevent a generation of cracks and delamination due to the difference in sintering density, preferably, a ratio of the width LM of the L-margin portion 116 to the thickness B of the lower cover layer 113 satisfies 0.3≤LM/B≤2.0, and a ratio of the thickness B of the lower cover layer 113 to the width WM of the W-margin portion 117 satisfies 0.5≤B/WM≤5.0.

Experimental Example

Multilayer ceramic capacitors (MLCC) according to embodiments of the present invention and comparative examples were fabricated as follows.

The MLCCs according to the Examples were manufactured through the following steps.

First, a slurry including powder such as barium titanate ($BaTiO_3$), or the like, was applied to a carrier film and then dried to prepare a plurality of ceramic green sheets having a thickness of 1.8 μm.

Next, internal electrodes were formed by applying a conductive paste for a nickel internal electrode on the ceramic green sheets by using a screen.

About three hundreds and seventy (370) ceramic green sheets were laminated, and here, a larger number of ceramic green sheets without an internal electrode were laminated below ceramic green sheets with an internal electrode formed thereon than those above the ceramic green sheets with an internal electrode formed thereon. The laminate (or lamination body) was isostatic-pressed under a pressure condition of 1000 kgf/cm$^2$ at 85° C. The pressing-completed ceramic laminate was severed into individual chips, and a debinding process was performed by maintaining the severed chips at 230° C. for 60 hours under air atmosphere.

Thereafter, the chips were fired at an oxygen partial pressure of $10^{-11}$ atm~$10^{-10}$ atm, lower than a Ni/NiO equilibrium oxygen partial pressure, under a reduced atmosphere such that the internal electrodes were not oxidized. After the firing operation, a chip size (length×width (L×W)) of a laminated chip capacitor was 1.64 mm×0.88 mm (L×W, 1608 size). Here, a fabrication tolerance was determined to be ±0.1 mm in length×width, and acoustic noise of a chip satisfying the fabrication tolerance was measured (Table 1) in test and a generation of cracks was observed and insulation resistance defect was measured (Table 2) in 8585 test.

Thereafter, the chip was subjected to processes such as an external electrode formation process, a plating process, and the like, to fabricate an MLCC.

TABLE 1

| sample | A (μm) | B (μm) | C (μm) | D (μm) | (B + C)/A | B/A | D/B | C/B | AN (dB) | Capacitance implementation rate |
|---|---|---|---|---|---|---|---|---|---|---|
| 1* | 405.5 | 40.2 | 365.4 | 39.9 | 1.000 | 0.099 | 0.993 | 9.090 | 29.5 | OK |
| 2* | 436.0 | 70.4 | 365.9 | 69.7 | 1.001 | 1.161 | 0.990 | 5.197 | 25.7 | OK |
| 3* | 455.5 | 90.8 | 364.3 | 91.5 | 0.999 | 0.199 | 1.008 | 4.012 | 23.1 | OK |
| 4* | 508.1 | 24.9 | 361.1 | 269.1 | 0.760 | 0.049 | 10.807 | 14.502 | 31.2 | OK |
| 5* | 456.6 | 25.2 | 360.1 | 167.8 | 0.844 | 0.055 | 6.659 | 14.290 | 32.5 | OK |
| 6* | 527.3 | 30.2 | 191.0 | 642.4 | 0.419 | 0.057 | 21.272 | 6.325 | 30.3 | OK |
| 7* | 414.5 | 30.9 | 188.8 | 420.4 | 0.530 | 0.075 | 13.605 | 6.110 | 30.5 | OK |
| 8* | 516.2 | 39.4 | 360.7 | 271.5 | 0.775 | 0.076 | 6.891 | 9.155 | 28.2 | OK |
| 9* | 446.0 | 39.8 | 365.5 | 121.2 | 0.909 | 0.089 | 3.045 | 9.183 | 29.1 | OK |
| 10* | 469.1 | 40.6 | 364.2 | 169.1 | 0.863 | 0.087 | 4.165 | 8.970 | 27.9 | OK |
| 11* | 416.2 | 40.7 | 360.7 | 70.3 | 0.964 | 0.098 | 1.727 | 8.862 | 28.4 | OK |
| 12* | 428.3 | 40.8 | 360.0 | 95.7 | 0.936 | 0.095 | 2.346 | 8.824 | 28.9 | OK |
| 13* | 495.9 | 40.9 | 364.9 | 221.0 | 0.818 | 0.082 | 5.403 | 8.922 | 28.1 | OK |
| 14* | 435.9 | 25.0 | 421.3 | 4.2 | 1.024 | 0.057 | 0.168 | 16.852 | 31.6 | OK |
| 15* | 420.7 | 70.4 | 365.9 | 39.1 | 1.037 | 0.167 | 0.555 | 5.197 | 25.7 | OK |
| 16 | 431.7 | 94.8 | 364.3 | 40.0 | 1.063 | 0.220 | 0.422 | 3.843 | 19.9 | OK |
| 17 | 443.0 | 103.8 | 389.1 | 4.0 | 1.113 | 0.234 | 0.039 | 3.749 | 19.3 | OK |

TABLE 1-continued

| sample | A (μm) | B (μm) | C (μm) | D (μm) | (B + C)/A | B/A | D/B | C/B | AN (dB) | Capacitance implementation rate |
|---|---|---|---|---|---|---|---|---|---|---|
| 18 | 443.7 | 119.8 | 363.2 | 41.1 | 1.089 | 0.270 | 0.343 | 3.032 | 18.7 | OK |
| 19 | 447.1 | 147.3 | 362.1 | 22.7 | 1.139 | 0.329 | 0.154 | 2.458 | 17.9 | OK |
| 20 | 452.8 | 164.7 | 360.2 | 20.4 | 1.159 | 0.364 | 0.124 | 2.187 | 17.3 | OK |
| 21 | 448.7 | 170.3 | 361.0 | 5.1 | 1.184 | 0.380 | 0.030 | 2.120 | 17.2 | OK |
| 22 | 470.7 | 170.3 | 365.4 | 40.2 | 1.138 | 0.362 | 0.236 | 2.144 | 17.4 | OK |
| 23 | 491.9 | 220.3 | 360.8 | 41.8 | 1.181 | 0.448 | 0.190 | 1.638 | 16.9 | OK |
| 24 | 500.6 | 270.2 | 360.5 | 9.9 | 1.260 | 0.540 | 0.037 | 1.334 | 16.8 | OK |
| 25 | 516.9 | 270.4 | 361.8 | 39.7 | 1.223 | 0.523 | 0.147 | 1.338 | 16.7 | OK |
| 26 | 502.1 | 364.9 | 312.3 | 14.7 | 1.349 | 0.727 | 0.040 | 0.856 | 16.6 | OK |
| 27 | 407.5 | 421.8 | 189.1 | 14.9 | 1.499 | 1.035 | 0.035 | 0.448 | 16.6 | OK |
| 28 | 445.8 | 493.3 | 179.3 | 39.7 | 1.509 | 1.107 | 0.080 | 0.363 | 16.5 | OK |
| 29 | 483.7 | 632.0 | 160.1 | 15.2 | 1.638 | 1.307 | 0.024 | 0.253 | 16.4 | OK |
| 30 | 520.0 | 643.4 | 190.7 | 15.2 | 1.604 | 1.237 | 0.024 | 0.296 | 16.4 | OK |
| 31 | 486.4 | 685.3 | 121.1 | 45.3 | 1.658 | 1.409 | 0.066 | 0.177 | 16.4 | OK |
| 32 | 507.2 | 742.7 | 120.8 | 30.1 | 1.702 | 1.464 | 0.041 | 0.163 | 16.4 | OK |
| 33 | 515.2 | 773.9 | 118.2 | 20.1 | 1.732 | 1.502 | 0.026 | 0.153 | 16.4 | OK |
| 34 | 524.5 | 798.2 | 116.9 | 16.9 | 1.745 | 1.522 | 0.021 | 0.146 | 16.3 | OK |
| 35* | 533.4 | 832.4 | 109.8 | 14.8 | 1.766 | 1.561 | 0.018 | 0.132 | 16.3 | NG |
| 36* | 533.3 | 841.1 | 105.3 | 14.9 | 1.775 | 1.577 | 0.018 | 0.125 | 16.3 | NG |
| 37* | 534.1 | 849.7 | 101.2 | 16.1 | 1.780 | 1.591 | 0.019 | 0.119 | 16.3 | NG |

*indicates comparative example, and AN is acoustic noise

Data in Table 1 was obtained by measuring dimensions of a section of the central portion of the ceramic body 110 of the MLCC 100 taken in the length direction (L) and the thickness direction (T) from the central portion of the ceramic body 110 in the width (W) direction as shown in FIG. 3, based on images taken by a scanning electron microscope (SEM).

Here, as described above, A was defined as half of the overall thickness of the ceramic body 110, B was defined as a thickness of the lower cover layer 113, C was defined as half of the overall thickness of the active layer 115, and D was defined as a thickness of the upper cover layer 112.

In order to measure acoustic noise, a single sample (MLCC) per board for measuring acoustic noise was discriminated in a vertical direction and mounted on a PCB, and then, the board was mounted in a measurement jig.

Thereafter, a DC voltage and varied voltages were applied to both terminals of the sample mounted in the measurement jig by using a power DC power supply and a signal generator (or a function generator). Acoustic noise was measured through a microphone installed directly above the PCB.

In Table 1, samples 1 to 3 are comparative examples having a cover-symmetrical structure in which the thickness B of the lower cover layer 113 and the thickness D of the upper cover layer D were substantially similar, and samples 4 to 13 are comparative examples having a structure in which the thickness D of the upper cover layer 112 was greater than the thickness B of the lower cover layer.

Samples 14, 15, and 35 to 37 are comparative examples having a structure in which the thickness B of the lower cover layer 113 was greater than the thickness D of the upper cover layer 112, and samples 16 to 34 were embodiments of the present invention.

Here, when (B+C)/A was nearly 1, it means that the central portion of the active layer 115 does not greatly deviate from the central portion of the ceramic body 110. The (B+C)/A value of samples 1 to 3 having a cover-symmetrical structure in which the thickness B of the lower cover layer 113 and the thickness D of the upper cover layer 112 were substantially similar is nearly 1.

When (B+C)/A was greater than 1, it may mean that the central portion of the active layer 115 deviated from the central portion of the ceramic body 110 in an upward direction, and when (B+C)/A was smaller than 1, it may mean that the central portion of the active layer 115 deviated from the central portion of the ceramic body 110 in a downward direction.

Referring to Table 1, it can be seen that, in samples 16 to 34 in which the ratio (B+C)/A by which the central portion of the active layer 115 deviated from the central portion of the ceramic body 110 satisfied the range 1.063≤(B+C)/A≤1.745, acoustic noise was significantly reduced to less than 20 dB.

Also, samples 1 to 15 in which the ratio (B+C)/A by which the central portion of the active layer 115 deviated from the central portion of the ceramic body 110 was less than 1.063, had a structure in which the central portion of the active layer 115 scarcely deviated from the central portion of the ceramic body 110 or the central portion of the active layer 115 deviated from the central portion of the ceramic body 110 in a downward direction.

Samples 1 to 15 having (B+C)/A less than 1.063 have acoustic noise ranging from 25 dB to 32.5 dB, so it can be seen that samples 1 to 15 did not have an acoustic noise reduction effect in comparison to the embodiment of the present invention.

Also, in the case of samples 35 to 37 in which the ratio (B+C)/A by which the central portion of the active layer 115 deviated from the central portion of the ceramic body 110 exceeds 1.745, capacitance was lower than a target value, causing defective capacitance.

In Table 1, capacitance implementation rate (i.e., a ratio of capacitance to target capacitance value) indicated as 'NG' means that when a target capacitance value is 100%, a capacitance value against the target capacitance value is less than 80%.

Also, it can be seen that embodiments in which the ratio (D:B) between the thickness D of the upper cover layer 112 and the thickness B of the lower cover layer 113 satisfied the range 0.021≤D/B≤0.422 had considerably reduced acoustic noise.

Meanwhile, it can be seen that comparative examples in which the ratio (D:B) between the thickness D of the upper cover 112 and the thickness B of the lower cover layer 113 exceeded 0.422 had no effect of reducing acoustic noise.

If the ratio (D:B) between the thickness D of the upper cover layer 112 and the thickness B of the lower cover layer 113 is less than 0.021, the thickness B of the lower cover layer 113 is excessively great relative to the thickness D of the upper cover layer 112, potentially generating cracks and delamination and defective capacitance due to low capacitance in comparison to a target capacitance.

Among the embodiments, it can be seen that, in the samples 19 to 34 in which the ratio (B/A) of the thickness B of the lower cover layer 113 to the thickness A of the ceramic body 110 and the ratio (C/B) of the thickness C of the active layer 115 to the thickness B of the lower cover layer 113 satisfied the ranges of $0.329 \leq B/A \leq 1.522$ and $0.146 \leq C/B \leq 2.458$, respectively, acoustic noise was further reduced to less than 18 dB.

Meanwhile, it can be seen that, in the samples 35 to 37 in which the ratio (B/A) of the thickness B of the lower cover layer 113 to the thickness A of the ceramic body 110 exceeded 1.522 or the ratio (C/B) of the thickness C of the active layer 115 to the thickness B of the lower cover layer 113 was less than 0.146, capacitance in comparison to the target capacitance was so low as to generate defective capacitance.

TABLE 2

| sample | LM/B | B/WM | Generation of crack after sintering | Insulation resistance defect |
|---|---|---|---|---|
| 1* | 0.1 | 7.0 | 12/200 | 18/200 |
| 2* | 0.2 | 6.0 | 0/200 | 7/200 |
| 3 | 0.3 | 5.0 | 0/200 | 0/200 |
| 4 | 0.4 | 4.0 | 0/200 | 0/200 |
| 5 | 0.5 | 3.0 | 0/200 | 0/200 |
| 6 | 0.6 | 2.0 | 0/200 | 0/200 |
| 7 | 0.8 | 1.0 | 0/200 | 0/200 |
| 8 | 1.0 | 0.8 | 0/200 | 0/200 |
| 9 | 2.0 | 0.5 | 0/200 | 0/200 |
| 10* | 3.0 | 0.3 | 8/200 | 9/200 |
| 11* | 4.0 | 0.2 | 13/200 | 21/200 |

*indicates comparative example

Data in Table 2 was obtained by measuring dimensions of a section (FIG. 4) of the central portion of the ceramic body 110 of the MLCC 100 taken in the length direction (L) and the thickness direction (T) from the central portion of the ceramic body 110 in the width (W) direction, and dimensions of a section (FIG. 5) of the central portion of the ceramic body 110 of the MLCC 100 taken in the width direction (W) and the thickness direction (T) from the central portion of the ceramic body 110 in the length (L) direction, based on images taken by a scanning electron microscope (SEM).

Here, as described above, B, LM, and WM refer to a thickness of the lower cover layer 113, a width of the L-margin portion 116, and a width of the W-margin portion 117.

As for measurement of the insulation resistance defect, samples of MLCCs were left under conditions that humidity was 85% and a temperature was 85° C., and those having an insulation resistance value equal to or lower than $10^5\Omega$ were inspected and measured.

As shown in Table 2, when LM/B was less than 0.3 and B/WM exceeds 5.0, cracks were generated due to a difference in sintering density or the insulation resistance defect was high, and when LM/B exceeds 2.0 and B/WM was less than 0.5, debinding was not smoothly performed to thereby generate cracks.

In particular, in the case of sample 2, cracks were not generated after a sintering process, but it had high insulation resistance defect rate.

Thus, preferably, the dimensions of the MLCC satisfy $0.3 \leq LM/B \leq 2.0$ and $0.5 \leq B/WM \leq 5.0$.

Circuit Board with MLCC Mounted Thereon

Figure 6:
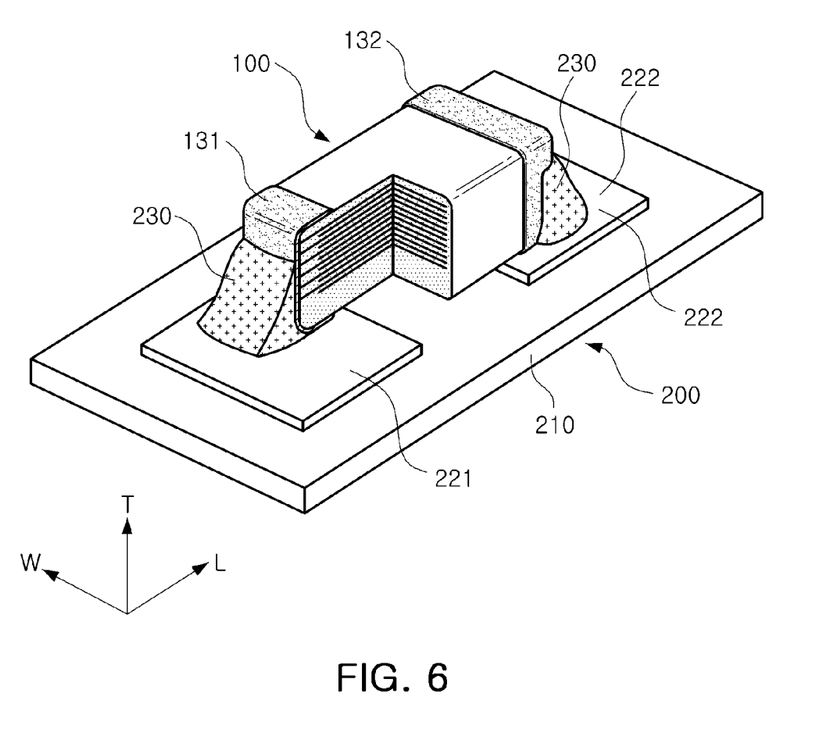
FIG. 6 is a perspective view illustrating the MLCC of FIG. 1 mounted on a printed circuit board (PCB)
Figure 7:
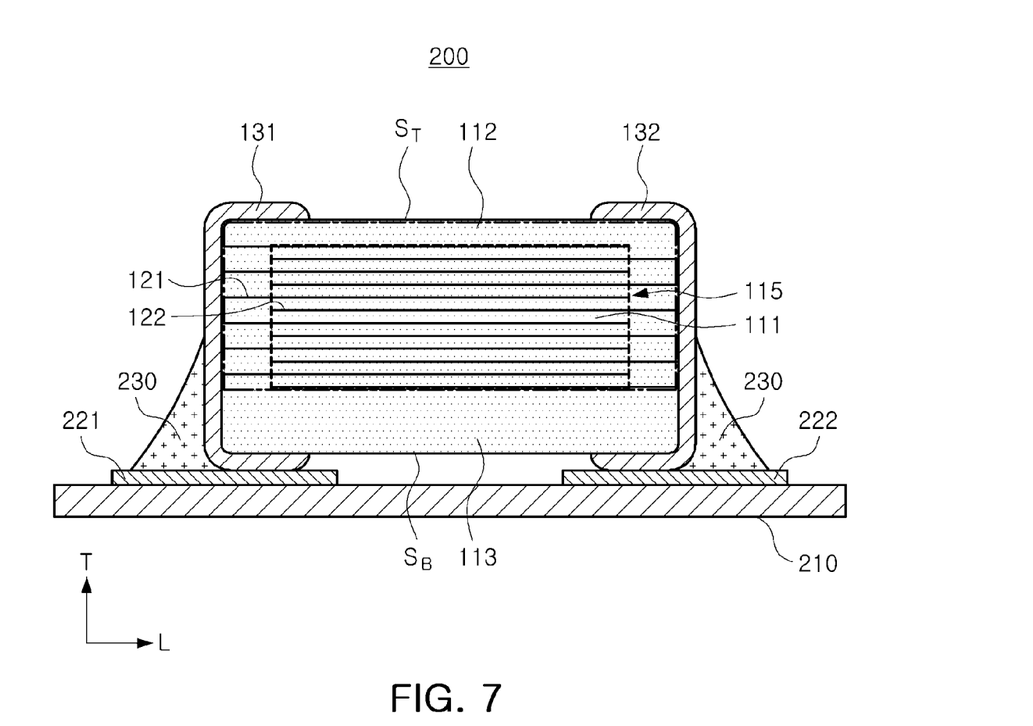
FIG. 7 is a cross-sectional view of the MLCC and PCB of FIG. 6 taken in the length direction.

Referring to FIGS. 6 and 7, a mounting board 200 of the MLCC 100 according to the present embodiment may include a PCB 210 on which the MLCC 10 is horizontally mounted and first and second electrode pads 221 and 222 formed to be spaced apart from one another on an upper surface of the PCB 210.

Here, in a state that the lower cover layer 113 of the MLCC 100 is disposed at the bottom and the first and second external electrodes 131 and 132 are in contact with the first and second electrode pads 221 and 222 on the first and second electrodes 221 and 222, the MLCC 100 may be electrically connected to the PCB 210 by solders 230.

In the state that the MLCC 100 is mounted on the PCB 210, when a voltage is applied, acoustic noise may be generated.

Here, the size of the first and second electrode pads 221 and 222 may be an indicator for determining an amount of the solder 230 connecting the first and second external electrodes 131 and 132 and the first and second electrode pads 221 and 222, and a magnitude of acoustic noise may be regulated according to an amount of the solder 230.

Figure 8:
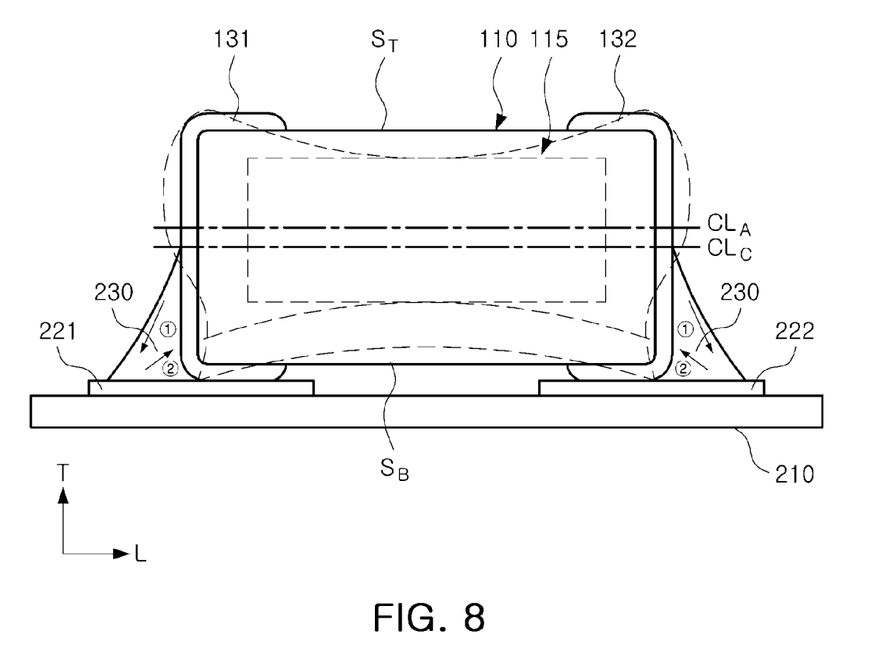
FIG. 8 is a schematic cross-sectional view illustrating the MLCC of FIG. 6 mounted on the PCB, deformed as voltage is applied thereto.

Referring to FIG. 8, with the MLCC 100 mounted on the PCB 210, when voltages having different polarities are applied to the first and second external electrodes 131 and 132 formed on both end portions of the MLCC 100, the ceramic body 110 expands and contracts in the thickness direction due to an inverse piezoelectric effect of the dielectric layers 111, while the both end portions of the first and second external electrodes 131 and 132 contract and expand due to a Poisson effect, contrary to the expansion and contraction of the ceramic body 110 in the thickness direction.

Here, the central portion of the active layer 115 is a portion maximally expanded and contracted in both end portions of the first and second external electrodes 131 and 132 in the length direction, causing acoustic noise.

When both end portions of the MLCC 100 in the length direction are maximally expanded, force ① thrusting upper portions of the solder 230 outwardly due to the expansion is generated, and contracting force ② thrusting the external electrodes is generated at the lower portions of the solder 230 by the force thrust to the outside.

Thus, as in the present embodiment, when the point of inflection (PI) formed at both end portions of the ceramic body is formed to be lower than the height of the solders due to a difference between strain generated in the central portion $CL_A$ of the active layer 115 and that generated in the lower cover layer 113 as a voltage is applied, acoustic noise can be further reduced.

Here, the structure of the active layer 115, the first and second internal electrodes 121 and 122, the upper and lower cover layers 112 and 113, and the first and second external electrodes 131 and 132 of the ceramic body 110 is similar to that of the former embodiment as described above, so a detailed description thereof will be omitted in order to avoid redundancy.

As set forth above, according to embodiments of the present invention, vibrations generated in the MLCC are reduced, and thus, when the MLCC is mounted on a PCB, acoustic noise can be reduced.

Also, according to an embodiment of the present invention, a generation of cracks and delamination can be reduced by adjusting dimensions of the cover layers and the margin portions of the MLCC.

While the present invention has been shown and described in connection with the embodiments, it will be apparent to those skilled in the art that modifications and variations can be made without departing from the spirit and scope of the invention as defined by the appended claims.

What is claimed is:

1. A multilayer ceramic capacitor comprising:
   a ceramic body in which a plurality of dielectric layers are laminated;
   an active layer including a plurality of first and second internal electrodes formed to be alternately exposed to both end surfaces of the ceramic body with the dielectric layer interposed therebetween, and forming capacitance;
   an upper cover layer formed on an upper portion of the active layer;
   a lower cover layer formed on a lower portion of the active layer and having a thickness greater than that of the upper cover layer; and
   first and second external electrodes covering both end surfaces of the ceramic body,
   wherein when a width of an L-margin portion formed between an end portion of the internal electrode in a length direction and one end surface of the ceramic body is LM, a width of a W-margin portion formed between a side of the internal electrode in a width direction and one lateral surface of the ceramic body is WM, and a thickness of the lower cover layer is B, $0.3 \le LM/B \le 2.0$ and $0.5 \le B/WM \le 5.0$ are satisfied, and
   when half of the overall thickness of the ceramic body is A, a thickness of the lower cover layer is B, half of the overall thickness of the active layer is C, and a thickness of the upper cover layer is D,
   a ratio $(B+C)/A$ by which a central portion of the active layer deviates from a central portion of the ceramic body satisfies $1.063 \le (B+C)/A \le 1.745$.

2. The multilayer ceramic capacitor of claim 1, wherein when the thickness of the lower cover layer is B and the thickness of the upper cover layer is D, a ratio (D/B) between the thickness D of the upper cover layer and the thickness B of the lower cover layer satisfies a range of $0.021 \le D/B \le 0.422$.

3. The multilayer ceramic capacitor of claim 1, wherein when half of the overall thickness of the ceramic body is A and the thickness of the lower cover layer is B,
   a ratio (B/A) of the thickness B of the lower cover layer to half A of the thickness of the ceramic body satisfies a range of $0.329 \le B/A \le 1.522$.

4. The multilayer ceramic capacitor of claim 1, wherein when the thickness of the lower cover layer is B and half of the overall thickness of the active layer is C,
   a ratio (C/B) of the half of the thickness of the active layer C to the thickness B of the lower cover layer satisfies a range of $0.146 \le C/B \le 2.458$.

5. The multilayer ceramic capacitor of claim 1, wherein due to a difference between strain generated in the central portion of the active layer and that generated in the lower cover layer when a voltage is applied, a point of inflection (PI) formed at both end portions of the ceramic body is formed below the central portion of the ceramic body in the thickness direction.

6. A circuit board for allowing a multilayer ceramic capacitor (MLCC) to be mounted thereon, the board comprising:
   a printed circuit board having first and second electrode pads formed on an upper portion thereof; and
   an MLCC installed on the PCB,
   wherein the MLCC comprises a ceramic body in which a plurality of dielectric layers are laminated, an active layer including a plurality of first and second internal electrodes formed to be alternately exposed to both end surfaces of the ceramic body with the dielectric layer interposed therebetween, and forming capacitance, an upper cover layer formed on an upper portion of the active layer, a lower cover layer formed on a lower portion of the active layer and having a thickness greater than that of the upper cover layer, and first and second external electrodes formed on both end surfaces of the ceramic body and connected to the first and second electrode pads by solders,
   wherein when a width of an L-margin portion formed between an end portion of the internal electrode in a length direction and one end surface of the ceramic body is LM, a width of a W-margin portion formed between a side of the internal electrode in a width direction and one lateral surface of the ceramic body is WM, and a thickness of the lower cover layer is B, $0.3 \le LM/B \le 2.0$ and $0.5 \le B/WM \le 5.0$ are satisfied, and
   when half of the overall thickness of the ceramic body is A, a thickness of the lower cover layer is B, half of the overall thickness of the active layer is C, and a thickness of the upper cover layer is D,
   a ratio $(B+C)/A$ by which a central portion of the active layer deviates from a central portion of the ceramic body satisfies $1.063 \le (B+C)/A \le 1.745$.

7. The circuit board of claim 6, wherein when the thickness of the lower cover layer is B and the thickness of the upper cover layer is D, a ratio (D/B or D:B) between the thickness D of the upper cover layer and the thickness B of the lower cover layer satisfies a range of $0.021 \le D/B \le 0.422$.

8. The circuit board of claim 6, wherein when half of the overall thickness of the ceramic body is A and the thickness of the lower cover layer is B,
   a ratio (B/A) of the thickness B of the lower cover layer to half A of the thickness of the ceramic body satisfies a range of $0.329 \le B/A \le 1.522$.

9. The circuit board of claim 6, wherein when the thickness of the lower cover layer is B and half of the overall thickness of the active layer is C,
   a ratio (C/B) of the half of the thickness of the active layer C to the thickness B of the lower cover layer satisfies a range of $0.146 \le C/B \le 2.458$.

10. The circuit board of claim 6, wherein due to a difference between strain generated in the central portion of the active layer and that generated in the lower cover layer when a voltage is applied, a point of inflection (PI) formed at both end portions of the ceramic body is formed below the central portion of the ceramic body in the thickness direction.

* * * * *